(12) United States Patent
Zhou et al.

(10) Patent No.: US 8,980,132 B2
(45) Date of Patent: Mar. 17, 2015

(54) BOROSILICATE LUMINESCENT MATERIAL AND PREPARING METHOD THEREOF

(75) Inventors: Mingjie Zhou, Shenzhen (CN); Qingtao Li, Shenzhen (CN); Wenbo Ma, Shenzhen (CN)

(73) Assignee: Ocean's King Lighting Science & Technology Co., Ltd., Shenzhen, Guangdong (CN)

( * ) Notice: Subject to any disclaimer, the term of this patent is extended or adjusted under 35 U.S.C. 154(b) by 396 days.

(21) Appl. No.: 13/574,545

(22) PCT Filed: Feb. 12, 2010

(86) PCT No.: PCT/CN2010/070683
§ 371 (c)(1),
(2), (4) Date: Jul. 20, 2012

(87) PCT Pub. No.: WO2011/097826
PCT Pub. Date: Aug. 18, 2011

(65) Prior Publication Data
US 2012/0286205 A1 Nov. 15, 2012

(51) Int. Cl.
C09K 11/80 (2006.01)
C09K 11/70 (2006.01)
C09K 11/81 (2006.01)
C09K 11/77 (2006.01)
H01L 33/00 (2010.01)
H01L 33/50 (2010.01)

(52) U.S. Cl.
CPC ......... C09K 11/7774 (2013.01); C09K 11/7777 (2013.01); C09K 11/778 (2013.01); *H01L 33/50* (2013.01)
USPC ........ 252/301.4 R; 252/301.4 P; 252/301.4 F

(58) Field of Classification Search
CPC .................................................. C09K 11/7774
USPC ........................ 252/301.4 F, 301.4 P, 301.4 R
See application file for complete search history.

(56) References Cited

U.S. PATENT DOCUMENTS

| 4,751,148 A | 6/1988 | Popma et al. |
| 5,108,959 A | 4/1992 | Buchanan et al. |
| 5,422,040 A | 6/1995 | Maofu et al. |

FOREIGN PATENT DOCUMENTS

| CN | 1180095 A | 4/1998 |
| CN | 101016457 A | 8/2007 |
| CN | 101033398 A | 9/2007 |
| CN | 101121886 A | 2/2008 |
| CN | 101462827 A | 6/2009 |
| EP | 2457883 A1 | 5/2012 |
| JP | 62121784 A | 6/1987 |
| JP | 62277488 A | 12/1987 |

*Primary Examiner* — Carol M Koslow
(74) *Attorney, Agent, or Firm* — Shimokaji IP

(57) ABSTRACT

Provided are a luminescent material and a preparing method thereof. The borosilicate luminescent material has a chemical formula of $aM_2O.bLn_2O_3.cAl_2O_3.dR_2O_3.eSiO_2.fCeO_2.gTb_2O_3$ or $aMO.bLn_2O_3.cAl_2O_3.dR_2O_3.eSiO_2.fCeO_2.gTb_2O_3$, wherein M is alkaline earth metal or alkali metal, Ln is one or two elements selected from the group consisting of elements Y and Gd; R is one or two elements selected from the group consisting of elements B and P; a, b, c, d, e, f, and g are molar fractions, and $6 \le a \le 20$, $3 \le b \le 12$, $20 \le c \le 30$, $32 \le d \le 45$, $0 \le e \le 12$, $0.01 \le f \le 1$, and $0.05 \le g \le 1.5$. The preparing methods comprises the following steps: 1) selecting source compounds of above elements; 2) mixing and grinding the source compounds to obtain a mixture; 3) presintering the mixture, then grinding the mixture; 4) sintering under reducing atmosphere, and cooling, thereby obtaining the luminescent material.

12 Claims, 5 Drawing Sheets

BOROSILICATE LUMINESCENT MATERIAL AND PREPARING METHOD THEREOF

FIELD OF THE INVENTION

The present disclosure relates to luminescent materials, especially to a borosilicate luminescent material and a preparing method thereof.

BACKGROUND OF THE INVENTION

With the breakthrough in the third generation of semiconductor material gallium nitride, and the advent of blue, green, white light emitting diode (LED), LED, which have a reputation for being the technology to illuminate the future, is walking into our lives and will guide us to illuminating light source. LED light source is a kind of new generation of light source. Primarily, a white LED can be obtained by the following methods: 1. coordinating blue LED with yellow fluorescence powder to produce white light; 2. encapsulating chips of different chromatic lights to produce white light by mixing different chromatic lights; and 3. excitation tricolor fluorescence powders by ultraviolet LED to produce white light.

At present, from the point of technology and application, white LED on the market is the white LED obtained by coordinating blue LED with yellow fluorescence powder. Because the white LED mainly contains blue light and lacks red light which presents a cool color, and color rendering index is lower, the application area of it is greatly limited. Encapsulating chips of different chromatic lights is provided. There are many disadvantages in practical promotion because the driver circuits of chips are complicated. Excitation tricolor fluorescence powders by using ultraviolet LED, producing white light by mixing different chromatic lights, can obtain LED light source with higher color rendering index, which is research hotspot. In tricolor fluorescence powders, green fluorescence powder with high luminous efficiency is used as sulfide fluorescence material, which has the problem that stability is not high enough. LED chips have an advantage of long lifespan, however, the lifespan of LED light source will be certainly affected because the stability of the used fluorescence material is not good.

SUMMARY OF THE INVENTION

The technical problem of the present invention to be solved is to provide a borosilicate luminescent material which have simple process, excellent quality, low cost, and can be broadly applied, and a preparing method thereof.

The technical solution to solve the technical problem in the present invention is: providing a luminescent material, the material has a chemical formula of $aM_2O \cdot bLn_2O_3 \cdot cAl_2O_3 \cdot dR_2O_3 \cdot eSiO_2 \cdot fCeO_2 \cdot gTb_2O_3$ or $aMO \cdot bLn_2O_3 \cdot cAl_2O_3 \cdot dR_2O_3 \cdot eSiO_2 \cdot fCeO_2 \cdot gTb_2O_3$, wherein, M is alkaline earth metal or alkali metal, Ln is selected from one or two elements of the group consisting of elements yttrium (Y) and gadolinium (Gd), R is selected from one or two elements of the group consisting of elements boron (B) and phosphorus (P), the a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$.

And, a preparing method for making a luminescent material comprises the following steps:

Step one, providing the compounds used as a source of $M^+$, the compounds used as a source of $Ln^{3+}$, the compounds used as a source of $Al^{3+}$, the compounds used as a source of $R^{3+}$, the compounds used as a source of silicon, the compounds used as a source of $Ce^{3+}$, and the compounds used as a source of $Tb^{3+}$, the stoichiometric ratio of each source compound complies with the molar ratio of elements in chemical formula of $aM_2O \cdot bLn_2O_3 \cdot cAl_2O_3 \cdot dR_2O_3 \cdot eSiO_2 \cdot fCeO_2 \cdot gTb_2O_3$ or $aMO \cdot bLn_2O_3 \cdot cAl_2O_3 \cdot dR_2O_3 \cdot eSiO_2 \cdot fCeO_2 \cdot gTb_2O_3$, wherein, a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$; M is alkaline earth metal or alkali metal, Ln is selected from one or two elements of the group consisting of Y and Gd, R is selected from one or two elements of the group consisting of B and P;

Step two, mixing and grinding the source compounds to get a mixture;

Step three, pre-sintering the mixture and then grinding the mixture to get a pre-sintered matter;

Step four, sintering the pre-sintered matter in reducing atmosphere and then cooling the sintered matter to get the said luminescent material.

In the preparing method of the present invention, the compounds used as a source of $M^+$ are selected from one or more ingredients of the group consisting of carbonate of $M^+$, nitrate of $M^+$, and oxalate of M. The compounds used as a source of $Ln^{3+}$ are selected from one or more ingredients of the group consisting of carbonate of $Ln^{3+}$, nitrate of $Ln^{3+}$, and oxalate of $Ln^{3+}$. The compounds used as a source of $Al^{3+}$ are selected from one or more ingredients of the group consisting of carbonate of $Al^{3+}$, nitrate of $Al^{3+}$, and oxalate of $Al^{3+}$. The compounds used as a source of $Ce^{3+}$ are selected from one or more ingredients of the group consisting of carbonate of $Ce^{3+}$, nitrate of $Ce^{3+}$, and oxalate of $Ce^{3+}$. The compounds used as a source of $Tb^{3+}$ are selected from one or more ingredients of the group consisting of carbonate of $Tb^{3+}$, nitrate of $Tb^{3+}$, and oxalate of $Tb^{3+}$. The compounds used as a source of silicon are silicon dioxide. The compounds used as a source of $R^{3+}$ are boric acid or phosphate.

In the preparing method of the present invention, the pre-sintering process in the said step three is carried out in air at 850° C. to 950° C. for 2 hours to 8 hours.

In the preparing method of the present invention, the sintering process in the said step four is carried out in reducing atmosphere at 750° C. to 880° C. for 2 hours to 6 hours.

In the preparing method of the present invention, the reducing atmosphere includes hydrogen ($H_2$) or a gas mixture of nitrogen ($N_2$) and $H_2$ or powdered carbon reducing atmosphere.

In the preparation method of the present invention, the alkaline earth metal M is at least one of calcium (Ca), strontium (Sr), and barium (Ba).

In the preparation method of the present invention, the alkali metal M is at least one of lithium (Li), sodium (Na), and potassium (K).

In the preparation method of the present invention, the optimal value ranges of a, b, c, d, e, f, and g are: $8 \leq a \leq 15$, $5 \leq b \leq 10$, $23 \leq c \leq 28$, $35 \leq d \leq 40$, $0 \leq e \leq 10$, $0.05 \leq f \leq 0.8$, and $0.2 \leq g \leq 1$.

The borosilicate luminescent material of the present invention takes advantage of Ce ion and Tb ion which can transit energy effectively to each other nonradiatively, that is, when the luminescence center is excited, the excitation energy of one location of the illuminant transits to another location of the illuminant, or the excitation energy of the luminescence center transits to another luminescence center, with which the luminescence intensity of the borosilicate luminescent material is greatly enhanced, and, the borosilicate luminescent material is with high stability and effective photoluminescence. Especially, exited by the 350 nm to 370 nm light, the borosilicate luminescent material has a stronger luminescence intensity than that of the commercial fluorescent powders such as $LaPO_4$:Ce, Tb, and ZnS:Cu under their optimal excitation conditions. The preparing method for making the borosilicate luminescent material of the present invention benefits the diffuse of rare-earth active ions in borosilicate luminescent material by two-stage reaction of oxidation and reduction, and benefits the grow up of crystal of luminescent.

BRIEF DESCRIPTION OF THE DRAWINGS

Further description of the present invention will be illustrated, which combined with drawings and embodiments in the drawings.

DETAILED DESCRIPTION OF ILLUSTRATED EMBODIMENTS

The examples hereinafter described merely being preferred or of the invention. It will be apparent that various changes may be made thereto without departing from the spirit and scope of the invention.

The present invention provides a borosilicate luminescent material, the borosilicate luminescent material has a chemical formula of $aM_2O \cdot bLn_2O_3 \cdot cAl_2O_3 \cdot dR_2O_3 \cdot eSiO_2 \cdot fCeO_2 \cdot gTb_2O_3$, wherein, M is alkaline earth metal or alkali metal, Ln is selected from one or two elements of the group consisting of Y and Gd, R is selected from one or two elements of the group consisting of B and P; the a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$.

The alkali metal M is selected from one or more ingredients of the group consisting of Li, Na, and K. The alkaline earth metal M is selected from one or more ingredients of the group consisting of Ca, Sr, and Ba. To obtain a much stronger green light, preferably, the value ranges of the a, b, c, d, e, f, and g are: $8 \leq a \leq 15$, $5 \leq b \leq 10$, $23 \leq c \leq 28$, $35 \leq d \leq 40$, $0 \leq e \leq 10$, $0.05 \leq f \leq 0.8$, and $0.2 \leq g \leq 1$.

The borosilicate luminescent material of the present invention takes advantage of Ce ion and Tb ion which can transit energy effectively to each other nonradiatively, that is, when the luminescence center is excited, the excitation energy of one location of the illuminant transits to another location of the illuminant, or the excitation energy of the luminescence center transits to another luminescence center, with which the luminescence intensity of the borosilicate luminescent material is greatly enhanced, and, the borosilicate luminescent material is with high stability and effective photoluminescence. Especially, exited by the 350 nm to 370 nm light, the borosilicate luminescent material has a stronger luminescence intensity than that of the commercial fluorescent powders such as $LaPO_4$:Ce, Tb, and ZnS:Cu under their optimal excitation peak conditions.

Figure 5:
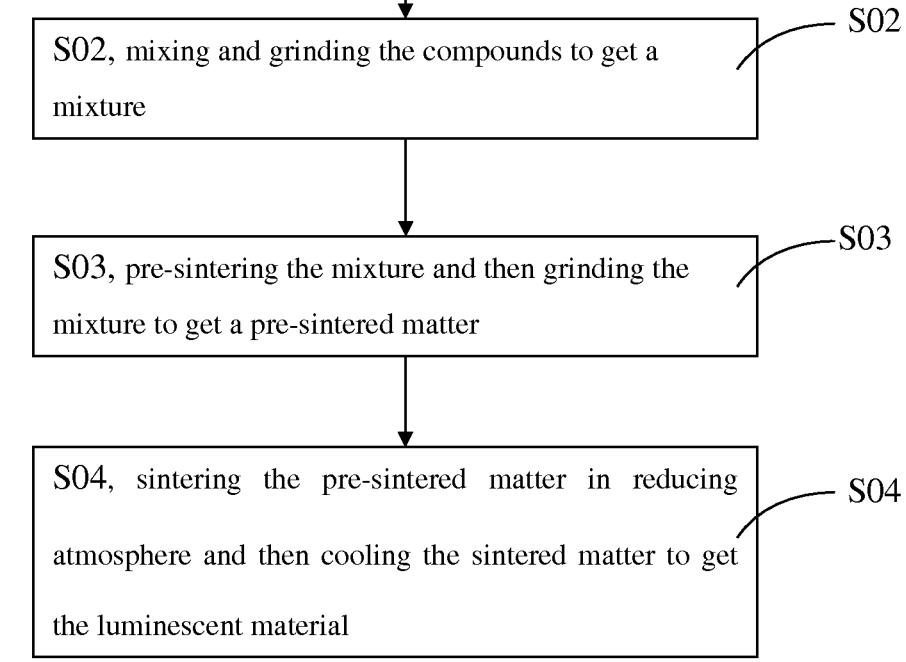
FIG. 5 shows a flow chat of preparation method of the borosilicate luminescent material.

Referring to FIG. 5, a preparing method for making the borosilicate luminescent material includes the following steps.

S01, the compounds used as a source of $M^+$, the compounds used as a source of $Ln^{3+}$, the compounds used as a source of $Al^{3+}$, the compounds used as a source of $R^{3+}$, the compounds used as a source of silicon, the compounds used as a source of $Ce^{3+}$, and the compounds used as a source of $Tb^{3+}$ are provided. The stoichiometric ratio complies with the molar ratio of the elements in the chemical formula of $aM_2O \cdot bLn_2O_3 \cdot cAl_2O_3 \cdot dR_2O_3 \cdot eSiO_2 \cdot fCeO_2 \cdot gTb_2O_3$, wherein, the a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$; M is alkaline earth metal or alkali metal, Ln is selected from one or two elements of the group consisting of Y and Gd, R is selected from one or two elements of the group consisting of B and P.

S02, mixing and grinding each source compound.

S03, pre-sintering the mixture and then grinding the mixture.

S04, sintering the pre-sintered matter in reducing atmosphere and then cooling the sintered matter to get the borosilicate luminescent material.

In step S01, the compounds used as a source of $M^+$ are selected from one or more ingredients of the group consisting of carbonate of $M^+$, nitrate of $M^+$, and oxalate of $M^+$. The compounds used as a source of $Ln^{3+}$ are selected from one or more ingredients of the group consisting of carbonate of $Ln^{3+}$, nitrate of $Ln^{3+}$, and oxalate of $Ln^{3+}$. The compounds used as a source of $Al^{3+}$ are selected from one or more ingredients of the group consisting of carbonate of $Al^{3+}$, nitrate of $Al^{3+}$, and oxalate of $Al^{3+}$. The compounds used as a source of $Ce^{3+}$ are selected from one or more ingredients of the group consisting of carbonate of $Ce^{3+}$, nitrate of $Ce^{3+}$, and oxalate of $Ce^{3+}$. The compounds used as a source of $Tb^{3+}$ are selected from one or more ingredients of the group consisting of carbonate of $Tb^{3+}$, nitrate of $Tb^{3+}$, and oxalate of $Tb^{3+}$. The compounds used as a source of silicon are silicon dioxide. The compounds used as a source of $R^{3+}$ are boric acid or phosphate.

In step S03, the pre-sintering process is carried out in air at 850° C. to 950° C. for 2 hours to 8 hours.

In step S04, the sintering process is carried out in reducing atmosphere (the reducing atmosphere includes hydrogen ($H_2$), or a gas mixture of nitrogen ($N_2$) and $H_2$, or powdered carbon) at 750° C. to 880° C. for 2 hours to 6 hours according to capacity of the oven, weight of material, material kinds, and different formulations. The sintered matter is then cooled to get the borosilicate luminescent material.

The preparing method for making the borosilicate luminescent material of the present invention benefits the diffuse of rare-earth active ions in borosilicate luminescent material by two-stage reaction of oxidation and reduction, and benefits the grow up of crystal of luminescent. The matrix of the borosilicate luminescent material can absorb energy and can effectively transit the energy to the rare-earth elements of the borosilicate luminescent material, the sensitization between the rare-earth elements enhance the luminescence intensity of the borosilicate luminescent material.

Special examples are disclosed as follows to demonstrate the borosilicate luminescent materials and preparation methods of the borosilicate luminescent materials.

Example 1

Figure 1:
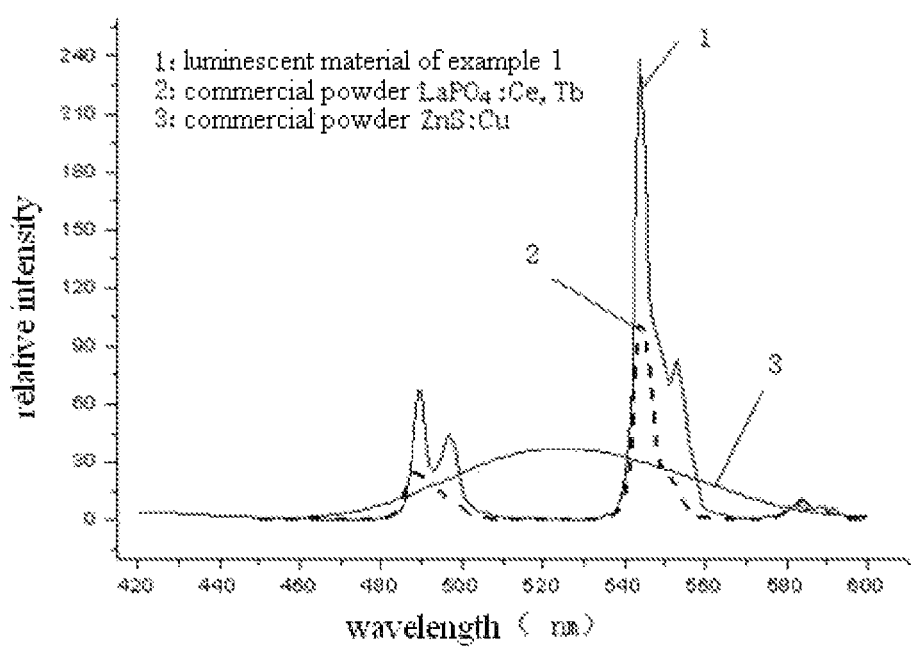
FIG. 1 shows an emission spectrum of the borosilicate luminescent material of example 1, and emission spectrums of the commercial fluorescent powders $LaPO_4$:Ce, Tb, and ZnS:Cu.

5.54 gram (g) lithium carbonate, 8.75 g yttrium oxide, 13.39 g aluminum oxide, 24.8 g boric acid, 3 g silicon dioxide, 0.43 g cerium oxide, and 1.869 g terbium oxide are provided and ball grinded for 30 minutes (min). The grinded matter is sintered in air at 930° C. for 6 hours and grinded again. After that, a sintering process is carried out in reducing atmosphere of a gas mixture of $N_2$ and $H_2$ to 820° C. and kept for 6 hours. A green borosilicate luminescent powder material having a chemical formula of $15Li_2O.7.75Y_2O_3.26.25Al_2O_3.40B_2O_3.10SiO_2.0.5CeO_2.1Tb_2O_3$ is obtained. Referring to FIG. 1, luminescent powder of the present invention and commercial powder $LaPO_4:Ce,Tb$ and $ZnS:Cu$ are excited under their optimal excitation peak conditions to get the emission spectrum. Curve 1 is an emission spectrum of the luminescent material of the present example 1, curve 2 is an emission spectrum of the commercial powder $LaPO_4:Ce,Tb$, and curve 3 is an emission spectrum of the commercial powder $ZnS:Cu$. The luminescent material of the present invention has a stronger luminescence intensity than that of the commercial powders. The equipments for testing the spectrums include a fluorescence spectrophotometer (produced by Dao-Jin company, type: RF-5301PC). The test is carried out under a condition of: low sensitivity, and 1.5 nm slit.

Example 2

Figure 2:
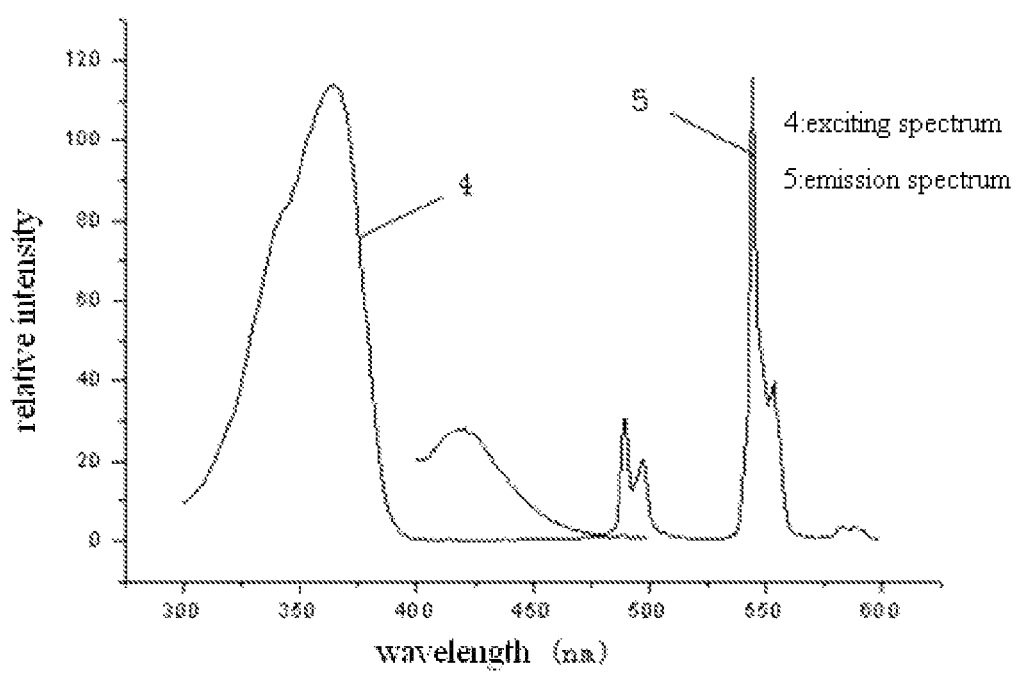
FIG. 2 shows an excitation spectrum and an emission spectrum of the borosilicate luminescent material of example 2.

7.95 g sodium carbonate, 8.75 g yttrium oxide, 13.39 g aluminum oxide, 24.8 g boric acid, 3 g silicon dioxide, 0.043 g cerium oxide, and 1.4954 g terbium oxide are provided and ball grinded for 30 min. The grinded matter is sintered in atmosphere at 900° C. and grinded again. After that, a sintering process is carried out in reducing atmosphere of a gas mixture of $N_2$ and $H_2$ to 880° C. and kept for 4 hours. A green borosilicate luminescent powder material having a chemical formula of $15Na_2O.7.75Y_2O_3.26.25Al_2O_3.40B_2O_3.10SiO_2.0.05CeO_2.0.8Tb_2O_3$ is obtained. The luminescent material of example 2 can be excited by 363 nm light to emit blue-green light. Referring to FIG. 2, curve 4 is an excitation spectrum of the luminescent material of the present example 2, curve 5 is an emission spectrum of the luminescent material of the present example 2. The equipments for testing the spectrums include a fluorescence spectrophotometer (produced by Dao-Jin company, type: RF-5301PC). The test is carried out under a condition of: low sensitivity, and 1.5 nm slit.

Example 3

Figure 3:
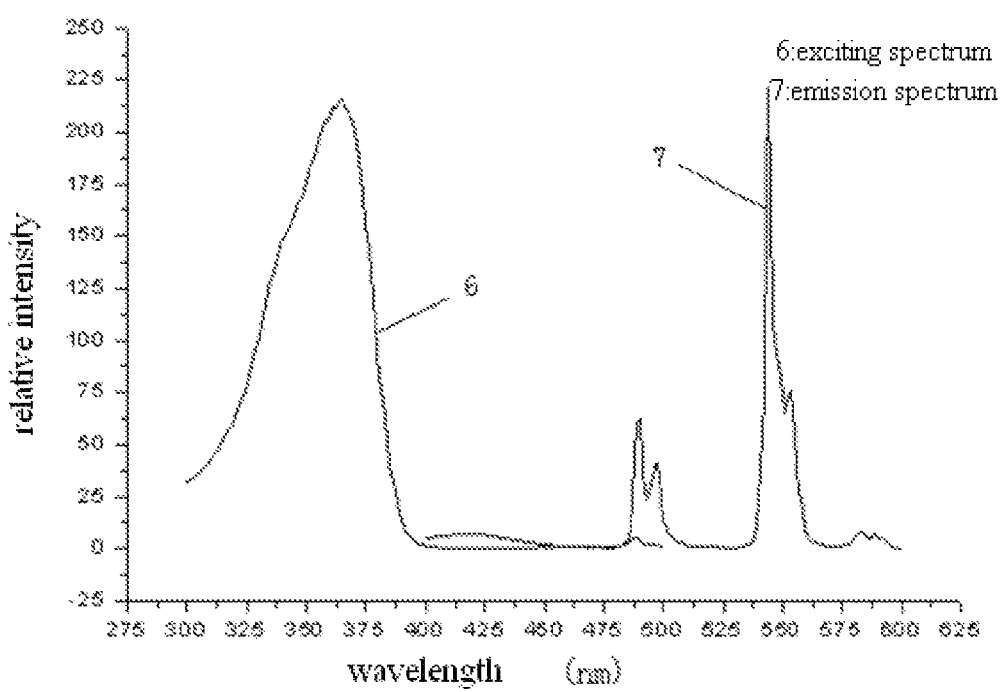
FIG. 3 shows an excitation spectrum and an emission spectrum of the borosilicate luminescent material of example 3.

7.95 g sodium carbonate, 8.75 g yttrium oxide, 13.39 g aluminum oxide, 24.8 g boric acid, 3 g silicon dioxide, 0.43 g cerium oxide, and 1.6823 g terbium oxide are provided and ball grinded for 30 min. The grinded matter is sintered in atmosphere at 920° C. and then grinded again. After that, a sintering process is carried out in reducing atmosphere of $H_2$ to 800° C. and kept for 2 hours. As such, a green borosilicate luminescent powder material having a chemical formula of $15Na_2O.7.75Y_2O_3.26.25Al_2O_3.40B_2O_3.10SiO_2.0.5CeO_2.0.9Tb_2O_3$ is obtained. The luminescent material of example 3 can be excited by 363 nm light to emit blue-green light. Referring to FIG. 3, curve 6 is an excitation spectrum of the luminescent material of the present example 3, curve 7 is an emission spectrum of the luminescent material of the present example 2. The equipments for testing the spectrums include a fluorescence spectrophotometer (produced by Dao-Jin company. The test is carried out under a condition of: low sensitivity, and 1.5 nm slit.

Example 4

3.18 g sodium carbonate, 21.75 g yttrium oxide, 15.3 g aluminum oxide, 27.9 g boric acid, 2.1 g silicon dioxide, 0.86 g cerium oxide, and 2.804 g terbium oxide are provided and ball grinded for 30 min. The grinded matter is sintered in atmosphere at 880° C. for 8 hours and grinded again. After that, a sintering process is carried out in reducing atmosphere of powdered carbon to 750° C. and kept for 6 hours. As such, a green borosilicate luminescent powder material having a chemical formula of $6Na_2O.7.75Gd_2O_3.30Al_2O_3.45B_2O_3.7SiO_2.1CeO_2.1.5Tb_2O_3$ is obtained.

Example 5

16.62 g potassium oxalate, 13.78 g yttrium nitrate, 42.6 g aluminum nitrate, 27.9 g boric acid, 3 g silicon dioxide, 0.0115 g cerium carbonate, and 0.1245 g terbium carbonate are provided and ball grinded for 30 min. The grinded matter is sintered in atmosphere at 900° C. for 8 hours and grinded again. After that, a sintering process is carried out in reducing atmosphere of powered carbon to 800° C. and kept for 5 hours. As such, a green borosilicate luminescent powder material having a chemical formula of $6K_2O.5Y_2O_3.20Al_2O_3.45B_2O_3.10SiO_2.0.01CeO_2.0.05Tb_2O_3$ is obtained.

Example 6

17 g sodium nitrate, 5.36 g yttrium carbonate, 23.4 g aluminum carbonate, 31.95 g phosphorous pentoxide, 3.6 g silicon dioxide, 1.304 g cerium nitrate, and 2.5875 g terbium nitrate are provided and ball grinded for 30 min. The grinded matter is sintered in atmosphere at 850° C. for 8 hours and then grinded again. After that, a sintering process is carried out in reducing atmosphere of a gas mixture of $N_2$ and $H_2$ to 750° C. and kept for 4 hours. As such, a green borosilicate luminescent powder material having a chemical formula of $20Na_2O.3Y_2O_3.20Al_2O_3.45P_2O_3.12SiO_2.0.8CeO_2.1.5Tb_2O_3$ is obtained.

Example 7

Figure 4:
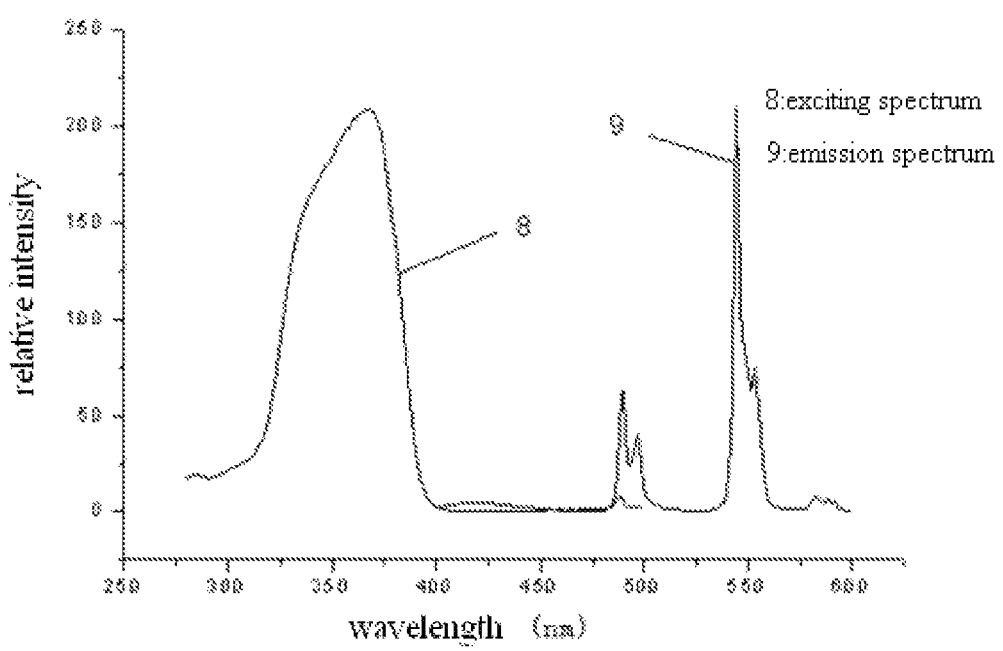
FIG. 4 shows an excitation spectrum and an emission spectrum of the borosilicate luminescent material of example 7.

6.17 g lithium carbonate, 9.709 g yttrium oxide, 14.892 g aluminum oxide, 26.64 g boric acid, 0.473 g cerium oxide, and 2.056 g terbium oxide are provided and ball grinded for 30 min. The grinded matter is sintered in atmosphere at 930° C. for 4 hours and then grinded again. After that, a sintering process is carried out in reducing atmosphere of a gas mixture of $N_2$ and $H_2$ to 790° C. and kept for 2 hours. As such, a green borosilicate luminescent powder material having a chemical formula of $16.7Li_2O.8.6Y_2O_3.29.2Al_2O_3.44.4B_2O_3O.0.55CeO_2.1.1Tb_2O_3$ is obtained. The luminescent material of example 7 can be excited by 367 nm light to emit blue-green light. Referring to FIG. 4, curve 8 is an excitation spectrum of the luminescent material of the present example 7, curve 9 is an emission spectrum of the luminescent material of the present example 7. The equipments for testing the spectrums include a fluorescence spectrophotometer (produced by Dao-Jin company, type: RF-5301PC). The test is carried out under a condition of: low sensitivity, and 1.5 nm slit.

Example 8

11.07 g strontium carbonate, 17.13 g yttrium oxalate, 41.73 g aluminum oxalate, 28.4 g phosphorous pentoxide, 3 g silicon dioxide, 0.6804 g cerium oxalate, and 2.91 g terbium oxalate are provided and ball grinded for 30 min. The grinded matter is sintered in atmosphere at 850° C. for 8 hours and then grinded again. After that, a sintering process is carried out in reducing atmosphere of a gas mixture of $N_2$ and $H_2$ to 760° C. and kept for 4 hours. As such, a green borosilicate luminescent powder material having a chemical formula of $15SrO.7.75Y_2O_3.26.25Al_2O_3.40P_2O_3.10SiO_2.0.5CeO_2.1Tb_2O_3$ is obtained.

Example 9

15.87 g strontium nitrate, 19.16 g gadolinium carbonate, 30.7 g aluminum carbonate, 28.4 g phosphorous pentoxide, 3 g silicon dioxide, 0.92 g cerium carbonate, and 2.987 g terbium carbonate are provided and ball grinded for 30 min. The grinded matter is sintered in atmosphere at 850° C. for 8 hours and grinded again. After that, a sintering process is carried out in reducing atmosphere of $H_2$ to 780° C. and kept for 6 hours. A green borosilicate luminescent powder material $15SrO.7.75Gd_2O_3.26.25Al_2O_3.40P_2O_3.10SiO_2.0.8CeO_2.1.2Tb_2O_3$ is obtained.

Example 10

10.2 g lithium oxalate, 13.78 g yttrium nitrate, 23.4 g aluminum carbonate, 31.95 g phosphorous pentoxide, 3 g silicon dioxide, 0.086 g cerium oxide, and 1.308 g terbium oxide are provided and ball grinded for 30 min. The grinded matter is sintered in atmosphere at 850° C. for 8 hours and then grinded again. After that, a sintering process is carried out in reducing atmosphere of $H_2$ to 780° C. and kept for 8 hours. As such, a green borosilicate luminescent powder material having a chemical formula of $20Li_2O.5Y_2O_3.20Al_2O_3.45P_2O_3.10SiO_2.0.1CeO_2.0.7Tb_2O_3$ is obtained.

Example 11

12.3 g calcium nitrate, 22.42 g gadolinium oxalate, 41.74 g aluminum oxalate, 24.8 g boric acid, 3 g silicon dioxide, 1.63 g cerium nitrate, and 1.869 g terbium oxide are provided and ball grinded for 30 min. The grinded matter is sintered in atmosphere at 880° C. for 6 hours and then grinded again. After that, a sintering process is carried out in reducing atmosphere of $H_2$ to 780° C. and kept for 7 hours. As such, a green borosilicate luminescent powder material having a chemical formula of $15CaO.7.75Gd_2O_3.26.25Al_2O_3.40B_2O_3.10SiO_2.1CeO_2.1Tb_2O_3$ is obtained.

Example 12

20.277 g barium oxalate, 14.312 g yttrium carbonate, 34.98 g aluminum oxalate, 24.8 g boric acid, 3 g silicon dioxide, 1.035 g cerium carbonate, and 2.803 g terbium oxide are provided and ball grinded for 30 min. The grinded matter is sintered in atmosphere at 880° C. for 8 hours and then grinded again. After that, a sintering process is carried out in reducing atmosphere of $H_2$ to 780° C. and kept for 6 hours. As such, a green borosilicate luminescent powder material having a chemical formula of $18BaO.8Y_2O_3.22Al_2O_3.40B_2O_3.10SiO_2.0.9CeO_2.1.5Tb_2O_3$ is obtained.

Example 13

12.8 g calcium oxalate, 29.67 g gadolinium carbonate, 59.64 g aluminum nitrate, 24.8 g boric acid, 0.688 g cerium oxide, and 2.43 g terbium oxide are provided and ball grinded for 30 min. The grinded matter is sintered in atmosphere at 850° C. for 8 hours and then grinded again. After that, a sintering process is carried out in reducing atmosphere of a gas mixture of $N_2$ and $H_2$ to 800° C. and kept for 6 hours. As such, a green borosilicate luminescent powder material having a chemical formula of $20CaO.12Gd_2O_3.28Al_2O_3.40B_2O_3.0.8CeO_2.1.3Tb_2O_3$ is obtained.

Example 14

7.5 g calcium carbonate, 14.05 g gadolinium oxide, 13.39 g aluminum oxide, 28.4 g phosphorous pentoxide, 3 g silicon dioxide, 0.258 g cerium oxide, and 1.869 g terbium oxide are provided and ball grinded for 30 min. The grinded matter is sintered in atmosphere at 850° C. for 8 hours and grinded again. After that, a sintering process is carried out in reducing atmosphere of a gas mixture of $N_2$ and $H_2$ to 760° C. and kept for 6 hours. A green borosilicate luminescent powder material $15CaO.7.75Gd_2O_3.26.25Al_2O_3.40P_2O_3.10SiO_2.0.3CeO_2.1Tb_2O_3$ is obtained.

Example 15

11.1 g sodium oxalate, 12.36 g gadolinium carbonate, 10.2 g aluminum oxide, 27.9 g boric acid, 3 g silicon dioxide, 0.086 g cerium oxide, and 1.75 g terbium carbonate are provided and ball grinded for 30 min. The grinded matter is sintered in atmosphere at 850° C. for 8 hours and then grinded again. After that, a sintering process is carried out in reducing atmosphere of $H_2$ to 780° C. and kept for 6 hours. As such, a borosilicate luminescent material having a chemical formula of $20Na_2O.5Gd_2O_3.20Al_2O_3.45B_2O_3.10SiO_2.0.1CeO_2.0.7Tb_2O_3$ is obtained.

Example 16

15.15 g potassium nitrate, 19.16 g gadolinium carbonate, 13.39 g aluminum oxide, 24.8 g boric acid, 3 g silicon dioxide, 0.258 g cerium oxide, and 2.485 g terbium carbonate are provided and ball grinded for 30 min. The grinded matter is sintered in atmosphere at 850° C. for 8 hours and then grinded again. After that, a sintering process is carried out in reducing atmosphere of $H_2$ to 750° C. and kept for 6 hours. As such, a green borosilicate luminescent powder material having a chemical formula of $15K_2O.7.75Gd_2O_3.26.25Al_2O_3.40B_2O_3.10SiO_2.0.3CeO_2.1Tb_2O_3$ is obtained.

It is believed that the present invention and its advantages will be understood from the foregoing description, and it will be apparent that various changes may be made thereto without departing from the spirit and scope of the disclosure or sacrificing all of its advantages, the examples hereinbefore described merely being preferred or present invention of the disclosure.

What is claimed is:

1. A luminescent material, which has a chemical formula of $aM_2O.bLn_2O_3.cAl_2O_3.dR_2O_3.eSiO_2.fCeO_2.gTb_2O_3$ or $aMO.bLn_2O_3.cAl_2O_3.dR_2O_3.eSiO_2.fCeO_2.gTb_2O_3$, wherein, M is alkaline earth metal or alkali metal, Ln is selected from one or two elements of the group consisting of yttrium and gadolinium, R is selected from one or two elements of the group consisting of boron and phosphorus, the a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$.

2. The luminescent material according to claim 1, wherein said alkali metal M is selected from one or more ingredients of the group consisting of lithium, sodium, and potassium.

3. The luminescent materials according to claim 1, wherein said alkaline earth metal M is selected from one or more ingredients of the group consisting of calcium, strontium, and barium.

4. The luminescent materials according to claim 1, wherein the value ranges of the a, b, c, d, e, f, and g are: $8 \leq a \leq 15$, $5 \leq b \leq 10$, $23 \leq c \leq 28$, $35 \leq d \leq 40$, $0 \leq e \leq 10$, $0.05 \leq f \leq 0.8$, and $0.2 \leq g \leq 1$.

5. A preparing method for making a luminescent material, comprising the following steps of:
Step one, providing the compounds used as a source of W, the compounds used as a source of $Ln^{3+}$, the compounds used as a source of $Al^{3+}$, the compounds used as a source of $R^{3+}$, the compounds used as a source of silicon, the compounds used as a source of $Ce^{3+}$, and the compounds used as a source of $Tb^{3+}$, the stoichiometric ratio of each source compound complies with the molar ratio of the elements in the chemical formula of $aM_2O \cdot bLn_2O_3 \cdot cAl_2O_3 \cdot dR_2O_3 \cdot eSiO_2 \cdot fCeO_2 \cdot gTb_2O_3$ or $aMO \cdot bLn_2O_3 \cdot cAl_2O_3 \cdot dR_2O_3 \cdot eSiO_2 \cdot fCeO_2 \cdot gTb_2O_3$, wherein, the a, b, c, d, e, f, and g are molar fractions, and $6 \leq a \leq 20$, $3 \leq b \leq 12$, $20 \leq c \leq 30$, $32 \leq d \leq 45$, $0 \leq e \leq 12$, $0.01 \leq f \leq 1$, and $0.05 \leq g \leq 1.5$; M is alkaline earth metal or alkali metal, Ln is selected from one or two elements of the group consisting of yttrium and gadolinium, R is selected from one or two elements of the group consisting of boron and phosphorus;
Step two, mixing and grinding the source compounds to get a mixture;
Step three, pre-sintering the mixture and then grinding the mixture to get a pre-sintered matter;
Step four, sintering the pre-sintered matter in reducing atmosphere and then cooling the sintered matter to get the said luminescent material.

6. The preparing method for making a luminescent material according to claim 5, wherein the compounds used as a source of $M^+$ is selected from one or more ingredients of the group consisting of carbonate of $M^+$, nitrate of $M^+$, and oxalate of $M^+$, the compounds used as a source of $Ln^{3+}$ is selected from one or more ingredients of the group consisting of carbonate of $Ln^{3+}$, nitrate of $Ln^{3+}$, and oxalate of $Ln^{3+}$, the compounds used as a source of $Al^{3+}$ is selected from one or more ingredients of the group consisting of carbonate of $Al^{3+}$, nitrate of $Al^{3+}$, and oxalate of $Al^{3+}$, the compounds used as a source of $Ce^{3+}$ is selected from one or more ingredients of the group consisting of carbonate of $Ce^{3+}$, nitrate of $Ce^{3+}$, and oxalate of $Ce^{3+}$, the compounds used as a source of $Tb^{3+}$ is selected from one or more ingredients of the group consisting of carbonate of $Tb^{3+}$, nitrate of $Tb^{3+}$, and oxalate of $Tb^{3+}$, the compounds used as a source of silicon is silicon dioxide, the compounds used as a source of $R^{3+}$ is boric acid or phosphate.

7. The preparing method for making a luminescent material according to claim 5, wherein in step three, the pre-sintering process is carried out in air at 850° C. to 950° C. for 2 hours to 8 hours.

8. The preparing method for making a luminescent material according to claim 5, wherein in step four, the sintering process is carried out in reducing atmosphere at 750° C. to 880° C. for 2 hours to 6 hours.

9. The preparing method for making a luminescent material according to claim 8, wherein the reducing atmosphere is hydrogen, carbon monoxide, or a gas mixture of nitrogen and hydrogen.

10. The preparing method for making a luminescent material according to claim 5, wherein said alkaline earth metal M is at least one of calcium, strontium, and barium.

11. The preparing method for making a luminescent material according to claim 5, wherein said alkali metal M is at least one of lithium, sodium, and potassium.

12. The preparation methods for making a luminescent material according to claim 5, wherein the value ranges of the a, b, c, d, e, f, and g are: $8 \leq a \leq 15$, $5 \leq b \leq 10$, $23 \leq c \leq 28$, $35 \leq d \leq 40$, $0 \leq e \leq 10$, $0.05 \leq f \leq 0.8$, and $0.2 \leq g \leq 1$.

* * * * *